United States Patent [19]
Choi

[11] Patent Number: 6,103,555
[45] Date of Patent: Aug. 15, 2000

[54] METHOD OF IMPROVING THE RELIABILITY OF LOW-VOLTAGE PROGRAMMABLE ANTIFUSE

[75] Inventor: Jeong Yeol Choi, Fremont, Calif.

[73] Assignee: Integrated Device Technology, Inc., Santa Clara, Calif.

[21] Appl. No.: 08/661,188

[22] Filed: Jun. 10, 1996

[51] Int. Cl.[7] ................................................. H01L 21/82
[52] U.S. Cl. .......................... 438/131; 438/762; 438/769; 438/956; 438/600
[58] Field of Search ..................... 438/761, 762, 438/763, 769, 770, 775, 954, 600, 131; 257/530

[56] References Cited

U.S. PATENT DOCUMENTS

| | | |
|---|---|---|
| 4,581,622 | 4/1986 | Takasaki et al. . |
| 5,032,545 | 7/1991 | Doan et al. . |
| 5,106,773 | 4/1992 | Chen et al. . |
| 5,258,333 | 11/1993 | Shappir et al. . |
| 5,412,244 | 5/1995 | Hamdy et al. ........................... 257/530 |
| 5,422,291 | 6/1995 | Clementi et al. .......................... 437/43 |
| 5,478,765 | 12/1995 | Kwong et al. . |
| 5,550,400 | 8/1996 | Takagi et al. ............................. 257/530 |
| 5,610,084 | 3/1997 | Solo De Zaldivar .................... 438/600 |
| 5,661,071 | 8/1997 | Chor ........................................ 438/530 |
| 5,705,849 | 1/1998 | Zheng et al. ............................. 257/530 |
| 5,856,234 | 1/1999 | Chiang et al. ........................... 438/600 |
| 5,866,938 | 2/1999 | Takagi et al. ............................ 257/530 |

OTHER PUBLICATIONS

Lo, G.Q., et al.; "Highly Reliable $SiO_2/Si_3N_4$ Stacked Dielectric on Rapid–Thermal–Nitrided Rugged Polysilicon for High–Density DRAM's"; *IEEE Electron Device Letters*; vol. 13, No. 7; Jul. 1992; pp. 372–374.

Ando, K., et al.; "Ultrathin Silico Nirtride Capacitors Fabricated by in Situ Rapid Thermal Multi–processing for 256 Mb DRAM Cells"; ULSI Device Development Laboratories, NEC Corporation; 4B–3; pp. 47–48.

*Primary Examiner*—Carl Whitehead, Jr.
*Assistant Examiner*—Khanh Duong
*Attorney, Agent, or Firm*—Majestic, Parsons, Siebert & Hsue

[57] ABSTRACT

The reliability of an antifuse can be increased and/or the thickness of the antifuse dielectric can be decreased by the use of a rapid thermal nitridation nitride layer as part of the antifuse dielectric. The RTN nitride layer is denser and has fewer pinholes than nitride layers formed by chemical vapor deposition. The rapid thermal nitridation also produces a good contact with a bottom electrode containing silicon as well as providing a nucleation layer for any additional nitride layer formed by chemical vapor deposition. Increasing the reliability of the antifuse dielectric allows it to be thinner, and thus allows for the programming of the dielectric layer at lower programming voltages.

19 Claims, 1 Drawing Sheet

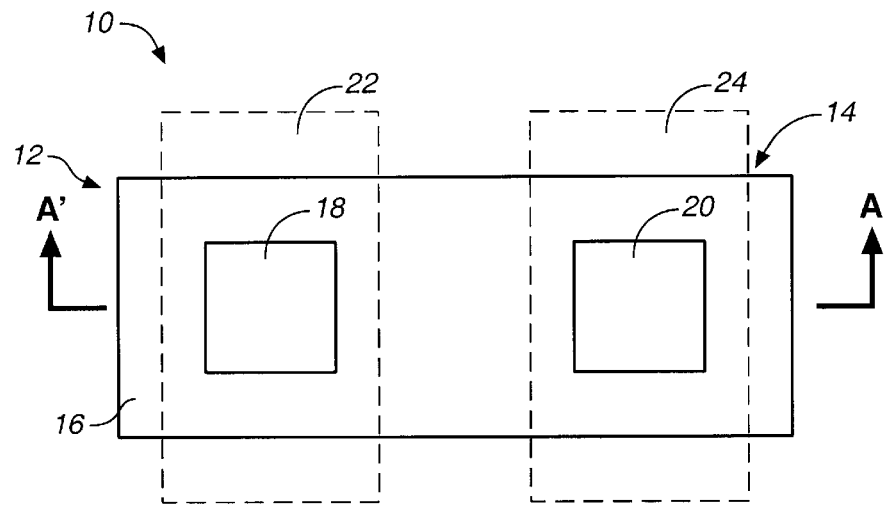
FIG._1
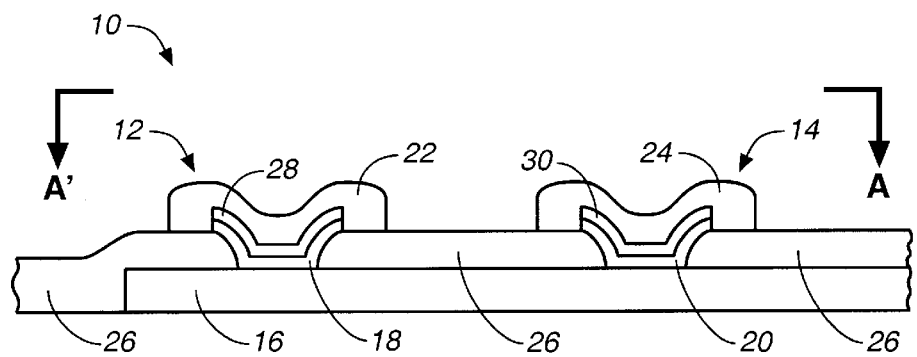
FIG._2
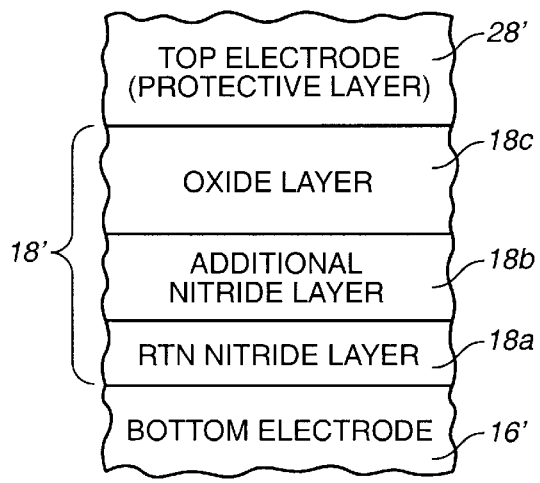
FIG._3

METHOD OF IMPROVING THE RELIABILITY OF LOW-VOLTAGE PROGRAMMABLE ANTIFUSE

BACKGROUND OF THE INVENTION

The present invention relates to antifuses used on a semiconductor circuit. The present invention especially relates to antifuses using composite dielectric layers.

Antifuses are used in memory devices or in field programmable gate arrays (FPGA). Antifuses are circuit elements that can be programmed to form a lower-impedance connection. A programming voltage across the electrodes of the antifuse breaks down an antifuse dielectric.

Antifuses are different from charge storing elements, such as erasable programmable memory (EPROM) or dynamic random access memory (DRAM). An antifuse's programming involves the permanent, unerasable breakdown of the antifuse dielectric.

There are two main types of antifuses. The first type uses amorphous polysilicon as the antifuse dielectric. This first type of antifuse is usually created between metallization layers. The other type of antifuse uses a composite dielectric layer as the antifuse dielectric.

An example of an antifuse with a composite dielectric layer is described in Hamdy et al. U.S. Pat. No. 5,412,244, incorporated herein by reference. The composite dielectric layer for the antifuse of the Hamdy et al. patent is described as preferably having a bottom oxide layer of 20 to 50 angstroms, a central silicon nitride layer of 40 to 100 angstroms, and a top oxide layer of 0 to 50 angstroms.

As circuits are scaled down and lower operating voltages are used, the programming voltage needs to be reduced to around six to seven volts from about nine volts. The thicknesses of the interlevel dielectrics, such as gate oxide layers, are reduced as the size of the circuits are reduced. It is important that the programming voltage not damage the thinner gate oxide layers causing shorts in the circuit.

There is thus a need for an antifuse dielectric that can reliably be used with low programming and operating voltages.

SUMMARY OF THE INVENTION

Producing a nitride layer against the bottom electrode by reacting a nitrogen containing gas (such as ammonia) with silicon in a bottom electrode layer can improve the quality of the antifuse dielectric. An antifuse dielectric formed in this manner will have fewer of the imperfections that can cause it to be damaged by operating voltages. For this reason, the thickness of the antifuse dielectric can be reduced to allow lower programming voltages.

In a preferred embodiment, the nitride layer against the bottom electrode is formed by rapid thermal nitridation (RTN). Rapid thermal nitridation involves the reaction of silicon in the bottom electrode layer with a nitrogen-containing gas at relatively high temperatures for relatively short periods of time. Rapid thermal nitridation uses higher temperatures for shorter periods of time than deposition by chemical vapor deposition (CVD).

The RTN nitride layer will be of better quality than a nitride layer formed by chemical vapor deposition. The RTN nitride layer has a better connection with the bottom electrode than nitride layers formed by chemical vapor deposition. This advantage results from the use of silicon in the bottom electrode to form the nitride layer. Silicon and nitride have different crystal structures, so typically the contact between a CVD nitride with the silicon would not be very good. The nitride layer formed by rapid thermal nitridation also provides a good nucleation layer for an additional CVD nitride layer.

Additionally, there are fewer pinholes in the nitride layer formed by rapid thermal nitridation than in a nitride layer formed by chemical vapor deposition. Pinholes in the dielectric layer may require a thicker dielectric layer to be used in order to prevent the dielectric layer from inadvertently being blown by the normal operating voltages on the circuit. For this reason, antifuse dielectrics that use a nitride layer formed by rapid thermal nitridation can be thinner, and thus will be able to be used with lower programming voltages.

Rapid thermal nitridation occurs relatively quickly, meaning that there is less chance for an oxide layer to be formed at the bottom electrode. The bottom silicon-containing electrode is very reactive with oxygen. Because of the relatively long processing times of chemical vapor deposition processes, even after an oxide layer is stripped from the bottom electrode, another oxide layer can be formed before the nitride layer can be deposited. Rapid thermal nitridation can reduce unwanted traces of oxide at the bottom electrode by around one level of magnitude.

In a preferred embodiment, to form the RTN nitride layer, silicon in the bottom electrode is reacted with ammonia gas ($NH_3$) for around one minute at about 900° C. This will produce a high-quality nitride layer of about ten angstroms thick.

BRIEF DESCRIPTION OF THE DRAWINGS

The above and other features of the present invention will become more apparent upon reading of the following detailed description in conjunction with the accompanying drawings, in which:

FIG. 1 is a top view of a semiconductor circuit showing two antifuses.

FIG. 2 is a cross-sectional view of the two antifuses of FIG. 1.

FIG. 3 is a cross-sectional view of the antifuse dielectric in a preferred embodiment of the present invention.

DETAILED DESCRIPTION OF THE PREFERRED EMBODIMENT

FIG. 1 is a top view of a semiconductor circuit 10 showing two antifuses 12 and 14. The bottom electrode 16, used for both antifuses 12 and 14, contains silicon. In a preferred embodiment, the bottom electrode 16 is a polysilicon layer, but a silicide layer or the silicon substrate can be used as well. If the bottom electrode is a polysilicon layer or the silicon substrate, it should be heavily doped in order to not have a depletion region in the electrode. A depletion region would make the required programming voltage higher due to the voltage drop across it. The level of doping in a preferred embodiment is about $10^{20}$ cm$^{-3}$.

The antifuse dielectric is positioned in areas 18 and 20. On top of the antifuse dielectric are the top electrodes 22 and 24. The top electrodes are preferably made of a silicon-containing material, such as polysilicon, but can be made of metal. Both the top and bottom electrodes are connected to programming means (not shown) which can selectively supply a programming voltage between the top and bottom electrodes in order to program the antifuse. The programming voltage, when it is supplied, will cause the dielectric material to break down and form a lower-impedance connection. In a preferred embodiment, in order to program the antifuse, one of the electrodes is supplied with the positive supply voltage, and the other electrode is supplied with the negative supply voltage. The same electrodes can be used to read the antifuses that are used to program the antifuses. The antifuses are selectively programmable. For example, antifuse 12 could be programmed and antifuse 14 not programmed.

When the antifuse is programmed, it produces a permanent, unerasable, lower-impedance connection. Once formed, the lower-impedance connection cannot practicably be removed. Removing the lower-impedance connection would require a very high current that leads to an electromigration of the dielectric layer. Once open by electromigration, the antifuse would be non-programmable by any practical method. The current required to cause a programmed dielectric layer to electromigrate is too high for any practical consideration.

FIG. 2 is a cross-sectional view of the circuit shown in FIG. 1. An interlevel dielectric 26 separates the electrodes. Antifuse dielectrics 18 and 20 are described below. Layers 28 and 30 are protective layers, which are placed over the antifuse dielectric in order to protect the antifuse dielectric during processing.

In the preferred embodiment, the antifuses are constructed as follows. A polysilicon layer for the bottom electrode 16 is formed. This polysilicon layer is etched back. Next, a dielectric layer 26 (gate oxide) is formed on top of the polysilicon layer. This dielectric layer 26 is etched back to form the contact areas for the antifuses with the bottom electrode. Next, antifuse dielectric layers are formed as discussed below with respect to FIG. 3. Looking again at FIG. 2, a protective layer 28, which is preferably a conductive polysilicon layer, is placed over the top of the antifuse dielectric layers. Next, photoresist is placed on top of the antifuse areas including the protective layer 28, and portions of the protective layer and antifuse dielectric layers are etched away. The protective layer 28 prevents the photoresist from lifting off some or all of the antifuse dielectric 18 and 20 when the photoresist is removed. Next, top electrodes 22 and 24 are placed on the protective layers and are etched to the required shape. Having different shapes for the antifuse dielectric layers (18 and 20) and the top electrodes (22 and 24) enables one to use the top electrode as a local router and local interconnect. For example, a top electrode of a first antifuse element may need to be connected to a bottom electrode of a second antifuse element. Higher layers (not shown), including metallization layers, are formed over the layers shown in FIG. 2.

FIG. 3 shows a cross-sectional view of the antifuse dielectric layers used in the preferred embodiment of the present invention. The antifuse dielectric 18' includes a rapid thermal nitridation layer 18a on the bottom electrode 16'. The rapid thermal nitridation layer 18a is formed in a preferred embodiment by stripping any oxide layer from the bottom electrode 16', then quickly putting the wafer into the rapid thermal processing machine to form an RTN nitride layer 18a. In a preferred embodiment, ammonia gas is used to react with some of the silicon from the bottom electrode 16'. The RTN nitride layer 18a is formed at a greater temperature for a shorter time period than the chemical vapor deposition nitride layer. The chemical vapor deposition nitride layer is typically produced with temperatures of about 600° C. for about two hours. The total processing time is about eight hours, including the time spent during stabilization. The RTN nitride layer 18a is preferably formed in less than five minutes. In a preferred embodiment, the RTN nitride layer 18a is formed in about a minute at a temperature of 900° C. or greater. The temperature can be below 900° C., but better reliability is obtained when RTN is performed at higher temperatures, due to the thicker RTN nitride layer that is formed. The ambient for the RTN process is typically $NH_3$ but may include $NF_3$ to enhance nitridation. Atmospheric pressures are typically used. In a preferred embodiment, a rapid thermal processing machine such as an AG8108 available from AG is used.

The RTN nitride layer is typically less than 20 angstroms in thickness (about 10 angstroms thick). It is currently impractical to obtain a thicker nitride layer with the RTN process. If it would be practical to grow the whole nitride thermally by RTN, that would be the preferred method. Presently, in order to obtain the desired nitride thickness, a deposited nitride layer is placed on the RTN nitride layer.

As discussed above, the RTN nitride layer 18a provides a good-quality dielectric layer that connects well with the silicon in the bottom electrode 16'. Because the bottom electrode is so reactive with oxygen at room temperature, and due to the concentration of oxygen in air, it is not practical to completely prevent any oxide from forming at the bottom electrode layer. This is especially true since some oxygen would likely slip into any oven or processing machine.

The rapid thermal nitridation layer 18a is a "high-quality nitride layer" because the nitride layer formed by rapid thermal nitridation will be denser and have fewer pinholes than a nitride layer formed with chemical vapor deposition of silicon nitride.

The additional nitride layer 18b can be formed by the chemical vapor deposition of silicon nitride. In a preferred embodiment, chemical vapor deposition of silicon nitride occurs by the reaction of silane gas ($SiH_4$) and ammonia gas ($NH_3$) at temperatures around 600° C. for around two hours. The entire processing time for this step takes about eight hours total, due to overhead and ramp-up time. This produces a nitride layer of around 30 angstroms thick.

Next, the oxide layer 18c is produced by a reaction of oxygen gas with the silicon nitride to form silicon dioxide. The oxide layer is about 25 to 30 angstroms thick. The additional nitride layer 18b is reduced to about 15 to 20 angstroms thick. About two angstroms of oxide is produced for every angstrom of nitride consumed from the additional nitride layer 18b. The oxide layer aids in the reliability of the composite antifuse layer. The combination of the nitride with the oxide produces a lower amount of leakage current, and allows for the dielectric to be used at reasonable programming voltages. The layer 28' is the protective layer which is part of the top electrode, as shown in FIG. 2.

Although several preferred embodiments of this invention have been described in detail herein with reference to the accompanying drawings, it is to be understood that the invention is not limited to these precise embodiments, and that various changes and modifications may be effected therein by one skilled in the art without departing from the scope or spirit of the invention as defined in the appended claims.

What is claimed is:

1. A method of forming an antifuse on a semiconductor circuit comprising:
   (a) providing a bottom electrode, the bottom electrode including silicon;
   (b) forming an antifuse dielectric on the bottom electrode, the antifuse dielectric including a nitride layer formed by reacting a nitrogen containing gas with silicon in the bottom electrode;

(c) forming a top electrode on the antifuse dielectric;

(d) programming by a voltage difference placed between the electrodes to make an permanent, unerasable, lower-impedance connection between the electrodes.

2. The method of claim 1, wherein the nitrogen-containing gas includes ammonia gas.

3. The method of claim 1, wherein the nitride layer is formed by rapid thermal nitridation.

4. The method of claim 3, wherein the antifuse dielectric forming step further comprises forming an additional nitride layer by chemical vapor deposition on the nitride layer formed by rapid thermal nitridation.

5. The method of claim 3, wherein the rapid thermal nitridation is done in less than five minutes.

6. The method of claim 3, wherein the rapid thermal nitridation is done in an environment heated to greater than 600° C.

7. The method of claim 6, wherein the rapid thermal nitridation is done in an environment heated to about 900° C. or greater.

8. The method of claim 1, wherein the antifuse dielectric includes a top oxide layer and wherein the top electrode is formed on this top oxide layer.

9. The method of claim 1, wherein there are traces of an oxide at the bottom electrode.

10. The method of claim 9, wherein said traces of an oxide are stripped off the bottom electrode before the nitride layer is formed.

11. The method of claim 1, wherein the top electrode forming step comprises forming a protective layer on the antifuse dielectric to protect the antifuse dielectric when photoresist is stripped off and then forming the remainder of the top electrode.

12. A method of forming an antifuse on a semiconductor circuit comprising:

(a) providing a bottom electrode, the bottom electrode including silicon;

(b) performing a rapid thermal nitridation on the bottom electrode so that a first nitride layer is formed on the bottom electrode;

(c) depositing an additional nitride layer on the first nitride layer;

(d) forming an oxide layer on the additional nitride layer;

(e) forming a top electrode on the oxide layer;

(f) programming by a voltage difference placed between the electrodes to make an permanent, unerasable, lower-impedance connection between the electrodes.

13. The method of claim 12, wherein the additional nitride layer deposition step is by the chemical vapor deposition of silicon nitride.

14. The method of claim 12, wherein the oxide forming step comprises oxidizing some of the additional nitride layer.

15. A method of forming antifuses comprising:

(a) providing bottom electrodes, the bottom electrodes including silicon;

(b) providing antifuse dielectric layers, the antifuse dielectric layers including nitride layers formed by reacting a nitrogen containing gas with silicon in the bottom electrodes;

(c) providing top electrodes on the antifuse dielectric layers; and (d) programming some of the antifuses by providing a voltage difference between some of the top and bottom electrodes to make a permanent, unerasable, lower-impedance connection between some of the top and bottom electrodes.

16. The method of claim 15, wherein the nitride layers are formed by rapid thermal nitridation.

17. The method of claim 15, wherein the dielectric layers include additional nitride layers deposited on the nitride layers.

18. The method of claim 17, wherein the dielectric layers include oxide layers formed on the additional nitride layers.

19. The method of claim 18, wherein the oxide layers are formed by oxidizing portions of the additional nitride layers.

* * * * *